United States Patent [19]

Roberts et al.

[11] Patent Number: 4,716,071

[45] Date of Patent: Dec. 29, 1987

[54] METHOD OF ENSURING ADHESION OF CHEMICALLY VAPOR DEPOSITED OXIDE TO GOLD INTEGRATED CIRCUIT INTERCONNECT LINES

[75] Inventors: Bruce E. Roberts; Jimmy C. Black, both of Palm Bay; Dyer A. Matlock, Melbourne, all of Fla.

[73] Assignee: Harris Corporation, Melbourne, Fla.

[21] Appl. No.: 768,326

[22] Filed: Aug. 22, 1985

[51] Int. Cl.$^4$ .......................... B32B 9/00; B32B 27/06
[52] U.S. Cl. .................................... 428/209; 428/469; 428/484; 428/701; 428/901
[58] Field of Search ............... 428/901, 701, 209, 469, 428/484

[56] References Cited

U.S. PATENT DOCUMENTS 4,417,387  11/1983  Heslop .................................... 29/591
4,533,605   8/1985  Hoffman ............................. 428/635

OTHER PUBLICATIONS

IBM Technical Disclosure Bulletin, vol. 13, No. 5, Oct. 1970, pp. 1118–1119, Pressman & Rideout.

Primary Examiner—John E. Kittle
Assistant Examiner—Patrick J. Ryan
Attorney, Agent, or Firm—Antonelli, Terry & Wands

[57] ABSTRACT

Adhesion of gold interconnects to silicon dioxide is achieved by forming, through chemical vapor deposition, or plasma enhanced chemical vapor deposition, an extremely thin film of titanium over the entirety of exposed surfaces of an integrated circuit structure on which the gold lines are disposed and over which a silicon dioxide layer is to be formed. This extremely thin film of titanium is then exposed to a flow of an oxidizer to convert the titanium to a film of (insulating) titanium oxide which, unlike gold, strongly adheres to silicon dioxide. Silicon dioxide is then deposited on the titanium oxide film. In the resulting multilayer interconnect structure, the insulator consists of a layer of silicon dioxide adhering to a thin adhesive layer of $TiO_x$ or $SiO_x$-$TiO_y$ at those locations whereat no gold lines are formed, while, on the gold conductor lines, the insulator contains silicon dioxide formed on a thin adhesive layer of $SiO_y$-$TiO_x$ atop a $TiO_y$-TiAu interface.

9 Claims, 5 Drawing Figures

METHOD OF ENSURING ADHESION OF CHEMICALLY VAPOR DEPOSITED OXIDE TO GOLD INTEGRATED CIRCUIT INTERCONNECT LINES

FIELD OF THE INVENTION

The present invention relates in general to semiconductor devices and is particularly directed to a methodology for effectively bonding a silicon dioxide layer to a gold interconnect layer.

BACKGROUND OF THE INVENTION

With the increase in speed, complexity and integration density of semiconductor circuits, gold has become a preferred conductor material due to its high conductivity and immunity to electromigration effects. In multilevel interconnect patterns through which regions in an underlying substrate are connected to each other and to external terminal pads, silicon dioxide is commonly used as a preferred dielectric material for insulating the gold interconnect lines from each other and from regions in the substrate over which the lines pass. Unfortunately, gold does not readily adhere to silicon dioxide, which leads to the problem of delamination of the interconnect structure, particularly as the dimensions of the integrated circuit become smaller and smaller, thereby effectively reducing the volume of gold relative to its available surface area for contact with the silicon dioxide.

One conventional approach in dealing with the nonadhesion of a gold/silicon dioxide interface has been to consider the problem as insignificant and simply ignore it, as in the case of large scale bipolar circuitry where charge trapping sites are not considered detrimental. Also, since gold lines adhere to underlying oxide through the use of a sputtered, evaporated, or other vacuum deposited overlay, the adhesion on the top and two sides of gold line is not considered to be critical. However, as lateral dimensions of the gold lines continue to shrink, while the vertical dimension, or thickness, of the gold lines remains relatively unchanged, the above-mentioned volume/surface area ratio decreases dramatically, so that the non-adhesion problem can no longer be considered to be insignificant.

In other interconnect configurations, such as those employing aluminum or polysilicon as the interconnect material, the nonadhesion problem of gold is not a consideration. However, neither of these materials (i.e. aluminum and polysilicon) possesses the stable conductive properties required, so that they introduce problems of their own.

Alternatively, it has been proposed to use a different dielectric insulator (usually silicon nitride). Like the proposed substitution of different conductor materials, this approach introduces another set of problems, including the fact that the resulting silicon oxide-silicon nitride interfaces can lead to charge trapping sites, thereby degrading device performance, particularly in the case of CMOS circuitry.

SUMMARY OF THE INVENTION

In accordance with the present invention, the problem of gold-silicon dioxide non-adhesion in a highly densified integrated circuit interconnect structure is solved through the use of a material that is known to exhibit strong bonding characteristics between gold and silicon dioxide, but conventional applications of which have made it unsuitable for use in the considerably reduced line widths of highly densified integrated circuits.

More particularly, titanium has been employed as a barrier layer for gold metallization layers, and its improved adhesion properties with silicon and silicon dioxide are documented in the literature, such as in Heslop U.S. Pat. No. 4,417,387 and in an Abstract entitled "Silver Metallurgy for Semiconductor Device" by F.M. Pressmen et al, I.B.M. Technical Disclosure Bulletin, Vol. 13, No. 5, October 1970, pp. 1118, 1119. However in such applications, the geometries of the barrier/adhesion layer of titanium are in the neighborhood of those of the gold metallization layer, or on the order of thousands of angstroms. Such thicknesses are unsuitable for use in submicron geometry applications from both an operational standpoint and a processing standpoint.

Where a thick layer of titanium is formed on the gold layer, the desired highly conductive properties of the gold layer are reduced due to the substantial resistance introduced by the titanium. In addition, processing of a thick barrier layer of titanium requires additional etching (of both the thick titanium overlay on the gold, particularly at the corners, and any titanium underlay extending onto a substrate surface (to prevent shorts)).

Pursuant to the present invention, rather than attempt to employ a relatively thick barrier layer of titanium (which is effectively useless in a submicron geometry environment) as a gold-to-silicon dioxide adhesion interface, an improved interconnection methodology solves the problem by forming, through chemical vapor deposition or plasma enhanced chemical vapor deposition, an extremely thin (on the order of several tens of to several hundred angstroms) film of titanium over the entirety of exposed surfaces of the integrated circuit structure on which gold lines are disposed and over which a silicon dioxide layer is to be formed. This extremely thin film of titanium is then exposed to a flow of an oxidizer to convert the titanium to a film of (insulating) titanium oxide which, unlike gold, strongly adheres to silicon dioxide. Silicon dioxide is then deposited on the titanium oxide film. In the resulting multilayer interconnect structure, the insulator consists of a layer of silicon dioxide adhering to a thin adhesive layer of $TiO_x$ or $SiOx\text{-}TiO_y$ at those locations whereat no gold lines are formed, while, on the gold conductor lines, the insulator contains silicon dioxide formed on a thin adhesive layer of $SiO_y\text{-}TiO_x$ atop a $TiO_y\text{-}TiAu$ interface. Because the adhesion film of titanium oxide is extremely thin, effectively complete conversion of the titanium to titanium oxide can be readily carried out, without the need for additional processing steps (such as etching of an unwanted thickness of titanium to prevent shorts, as mentioned above). Moreover, the thinness of the titanium, and resulting titanium oxide film, make the adhesion layer particularly applicable to submicron line width integrated circuit environments, as contrasted with the use of thick titanium layers, as described in the above-referenced literature, which are not suitable for such high density/high signal propagation/operation devices.

DETAILED DESCRIPTION

Referring now to FIGS. 1-4, the processing methodology for forming a titanium oxide layer for insuring the adhesion of chemically vapored deposited silicon dioxide to gold interconnect lines for an integrated circuit will be described.

Figure 1:
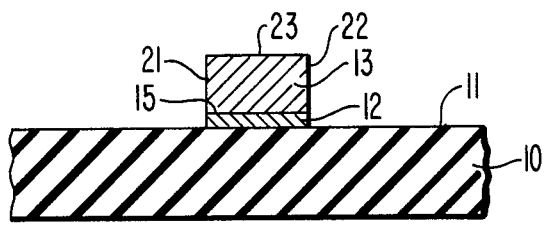
FIGS. 1–4 are diagrammatic cross-sectional views of respective steps of manufacture of an integrated circuit device and a gold-silicon dioxide interconnect structure having a titanium dioxide adhesion layer therebetween.

In FIG. 1, a layer 10, which may be either a substrate having elemental regions to be interconnected to one another or to external terminal pads through one or more interconnect lines, or which may be a layer of dielectric insulator material overlying such a structure as part of a multilayer conductor/dielectric insulator laminate, is shown as having a top surface 11. For purposes of the present description, it will be assumed that layer 10 is a layer of silicon dioxide that has been formed over a substrate containing a number of circuit elements. Thus, the silicon dioxide layer 10 may be considered to constitute part of the overlying interconnect/dielectric multilevel structure through which electrical signal paths to the integrated circuit are provided. As the details of the integrated circuit, per se, and its connection to the multilevel interconnect are unnecessary for an understanding of the present invention, they will not be described here. Instead, the description will focus upon the inventive solution to the problem of nonadhesion of gold to silicon dioxide, as addressed briefly above.

Overlying the top surface 11 of the silicon dioxide layer 10 is a gold track layer 13 which is to serve as a signal conductor within the interconnect laminate structure. Adhesion between the bottom surface 15 of the gold layer 13 and the top surface 11 of the silicon dioxide layer 10 is achieved by selectively forming a thin layer 12 of a suitable adhesive material, such as vacuum deposited titanium, having a thickness on the order of 100-2,000Å. Alternatively, another intermediate adhesive material such as nickel-chrome alloy or platinum deposited by physical vapor may be employed. For purposes of facilitating their illustration on the drawings, the thickness of each of the extremely thin titanium, titanium oxide films has been greatly exaggerated.

Figure 2:
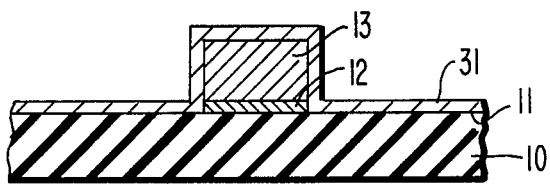

Next, as shown in FIG. 2, an extremely thin layer of titanium 31 is formed on the upper surface 11 of silicon dioxide layer 10 and on the side surfaces 21 and 22 and the top surface 23 of the gold layer 13. This thin layer of titanium is formed by a chemical vapor deposition process (with or without plasma enhancement) in which the environment above the substrate is reduced to a vacuum with a range from $10^{-1}$ to $10^{-4}$ Torr. Then $TiCl_4$ is supplied to the controlled evacuated environment of the chemical processing tube in which the wafer is placed, in a temperature range of 100°-500° C. to cause a very thin layer of titanium to be deposited on all exposed surfaces of the substrate, the three sides of the gold and the sides of the adhesive layer 12. This deposition step is carried out for a period of time in a range from one minute to one hour to produce an extremely thin film of titanium 31 having a thickness on the order of 10 to 500Å. Prior to introduction of the $TiCl_4$ into the system for the formation of the thin layer of titanium, the surface of the gold and the layer 10 may be activated by forming a thin film of water on the surface of the substrate by way of steam deposition, moist air or nitrogen flow.

Figure 3:
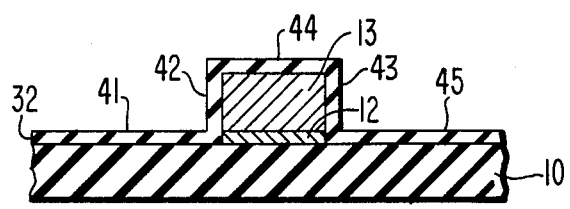

Next, the thin film of titanium 31 is converted into titanium dioxide by introducing an oxidizing agent, such as oxygen, into the deposition chamber, the oxidizer reacting with the thin exposed titanium film 31 to convert the film into $TiO_2$. The oxidizer flow may be carried out at a pressure of $10^{-1}$-$10^{-4}$ Torr for a period of time of from one minute to one hour and a temperature of from 100°-500° C., thereby readily converting the entirety of the titanium layer 31 to a thin film of titanium dioxide. As shown in FIG. 3, with the entirety of the thin film of titanium converted into titanium dioxide, the surface of the substrate is now covered with a thin insulator layer at portions 41 and 45 and the three exposed sides of the gold layer 13 are covered with a thin film of titanium dioxide, namely titanium dioxide portions 42 and 43 on sides 21 and 22 of the gold, and titanium dioxide portion 44 on the top surface 23 of the gold layer.

Figure 4:
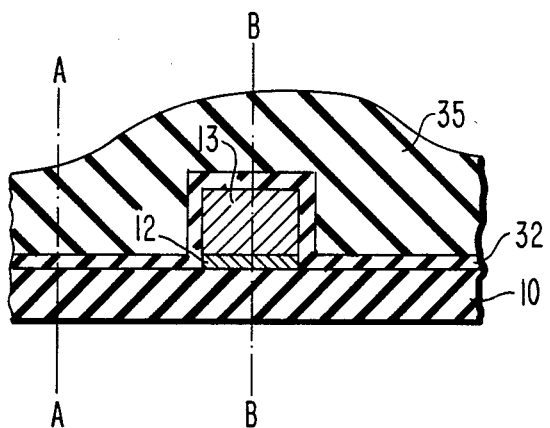

Next, as shown in FIG. 4, a silicon dioxide layer 35 is formed by chemical vapor deposition or plasma enhanced chemical vapor deposition, as for example by reacting oxygen with silane ($SiH_4$) or by the use of other commonly used reactants such as $N_2O$, $SiH_2Cl_2$. The thickness of the deposited silicon dioxide film 35 typically lies in a range of 0.4-1.5 $\mu$m. The deposition of the silicon dioxide film 35 may be carried out by either a chemical vapor deposition process or a plasma enhanced chemical vapor deposition process. Because the three sides 21, 22 and 23 of the gold line 13 have been initially coated with a thin film of titanium dioxide (portions 42, 43 and 44 shown in FIG. 3), the silicon dioxide layer 35 which is formed over the gold interconnect line strongly adheres to the gold, thereby avoiding the delamination problems mentioned above. From a composition standpoint, along lines A—A of FIG. 4, the multilayer structure consists of a laminate of $SiO_2$-$TiO_x$ $SiO_y$ (PE)CVD$SiO_2$, wherein x and y$\leq$2. This portion of the laminate is completely non-conductive, because of the conversion of the thin titanium film 31 to an oxide, or by the effective "consumption" of the titanium film 31 into the silicon dioxide network. This tying up of the titanium into the non-conductive structure is principally due to its high reactivity and the thin "porous" nature of the deposited titanium layer 31. The composition along that portion of the structure delineated by lines B—B of FIG. 4 consists of a laminate of $SiO_2M/M_x$-$Au/Au/TiAu$-$TiO_y$-$SiO_z$, where x, y and z$\leq$2 and M is the metal of adhesive layer 12.

In the foregoing description, a single gold interconnect line 13 is shown as being selectively formed on the surface of base layer 10, with titanium dioxide film 32 forming a laminate directly with the gold line 13 and the surface 11 of layer 10. Where plural gold lines are formed atop layer 10 a film of titanium dioxide for the plural gold lines may be non-selectively formed over the surfaces of all the gold lines and the surface of base layer 10 to provide effective insulation and to prevent shorts between adjacent lines and regions in the substrate. Such a configuration is diagrammatically shown in FIG. 5 wherein spaced-apart gold interconnect lines 51 and 52 are disposed over a base layer 10. Underlying each of gold interconnect lines 51 and 52 is a respective adhesive layer 53 and 54. Covering the gold interconnect lines is a titanium oxide film 55 which is formed in the manner of the embodiment of a single gold line in FIGS. 1-4, described above. Then a silicon dioxide layer 56 is formed over the titanium oxide film 55.

Figure 5:
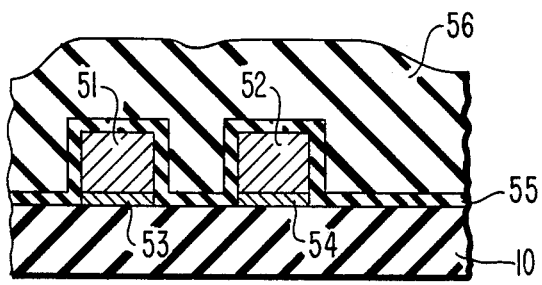
FIG. 5 is a diagrammatic cross-sectional view of an integrated circuit structure having a plurality of gold interconnect lines bonded to a layer of silicon dioxide by a titanium dioxide adhesion film.

In the embodiment of FIG. 5, because titanium oxide film 55 is an insulator there is no need to selectively etch through film 55 between gold lines 51 and 52 to prevent shorting therebetween and/or shorting of regions beneath film 55, as would be the case were a relatively thick layer of titanium nonselectively applied to the surface of layer 10 as a gold/silicon, silicon dioxide adhesive layer. Namely, because of the considerable thinness to which the titanium film is formed and the resulting converted titanium oxide layer obtained therefrom, further etching of any titanium layer subsequent to the formation of the film is unnecessary.

As pointed out previously, in larger geometry devices of the prior art, wherein the titanium layer has a thickness on the order of several thousand angstroms, the relatively thick layer of titanium alters the conductivity and corrosion resistance of the gold on which it is formed and, if used in an environment of a submicron geometry, would effectively create a short-circuiting titanium overlay which would have to be selectively etched. Thus, through the methodology of the present invention, the sought after high conductive, non-corrosive characteristics of the gold lines are not adversely affected, as would be the case through the use of a thick titanium layer. The thinness of the titanium dioxide layer, which provides the desired adhesion between the gold and silicon dioxide within the laminate, avoids the use of unnecessary additional processing, the thin titanium dioxide film being an insulator.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. A gold interconnect/oxide of silicon insulator structure for providing relatively insulated conductor paths overlying an integrated circuit-containing semiconductor body comprising:

a plurality of gold interconnected lines distributed over said semiconductor body;

a thin gold-to-oxide of silicon adhesion film formed on each of said gold interconnect lines, said film containing a first gold-titanium region contiguous with the gold of said gold interconnect lines and a second region of an oxide of titanius contiguous with said gold-titanium region; and a layer of an oxide of silicon formed on said thin gold-to-oxide of silicon adhesion film so as to be contiguous with second contiguous with the second region of an oxide of titanium thereof.

2. A structure according to claim 1, wherein said thin gold-to-oxide of silicon adhesion film has a thinkness in a range of 10 to 500Å.

3. A structure according to claim 1, further including a plurality of respective thin metallic adhesive layers formed on said semiconductor body beneath said gold interconnect lines so as to be contiguous with said gold interconnect lines and said semiconductor body.

4. A structure according to claim 1, wherein the composition of that portion of said structure along a line passing through a laminate of a gold interconnect line, a thin gold-to-oxide of silicon adhesion film thereon and a layer or an oxide of silicon dioxide is defined by Au/-TiAu-TiO$_y$-SiO$_z$, where y and z≦2.

5. A structure according to claim 1, further including a thin film of an oxide of titanium formed on said semiconductor body and being contiguous with said thin gold-to-oxide of silicon adhesion film, said layer of an oxide of silicon being formed on said thin film of an oxide of titanium.

6. A structure according to claim 3, wherein the composition of said structure along a line passing through a laminate of said semiconductor body, a metallic adhesive layer, a gold interconnect line, a thin gold-to-oxide of silicon adhesion film thereon an a layer of an oxide of silicon is defined by SBM/M$_x$Au/Au/TiAu - TiO$_y$-SiO$_z$, where x, y and z≦2, SB is the semiconductor body and M is the metal of said metallic adhesive layer.

7. A structure according to claim 6, further including a thin film of an oxide of titanium formed on said semiconductor body and being contiguous with said thin gold-to-oxide of silicon adhesion film, said layer of an oxide of silicon being formed on said thin film of an oxide of titanium.

8. A structure according to claim 7, wherein the composition of said structure along a line passing through a laminate of said semiconductor body, said thin film of an oxide of titanium and said layer of an oxide of silicon is defined by SB - TiO$_x$ - SiO$_y$, where SB is the semiconductor material of said semiconductor body and x and y≦2.

9. A structure according to claim 1, wherein said thin gold-to-oxide of silicon adhesion film has a thickness in a range of 10-100 angstroms.

* * * * *